(12) United States Patent
Koprivnak et al.

(10) Patent No.: US 8,233,280 B2
(45) Date of Patent: Jul. 31, 2012

(54) ELECTRONIC MODULE WITH CENTER MOUNTING FASTENERS

(75) Inventors: George Koprivnak, Painesville, OH (US); Robert Dodge, Mentor, OH (US); Jeremie Buday, Mentor, OH (US); David Perrin, Wadsworth, OH (US); Russ Myers, Hudson, OH (US)

(73) Assignee: Lincoln Global, Inc., City of Industry, CA (US)

(*) Notice: Subject to any disclaimer, the term of this patent is extended or adjusted under 35 U.S.C. 154(b) by 182 days.

(21) Appl. No.: 12/724,040

(22) Filed: Mar. 15, 2010

(65) Prior Publication Data

US 2011/0222245 A1  Sep. 15, 2011

(51) Int. Cl.
*H05K 7/20* (2006.01)

(52) U.S. Cl. ........ 361/709; 361/715; 361/722; 257/706; 165/80.2; 165/104.33; 174/252; 174/520; 174/548

(58) Field of Classification Search ............... 361/688, 361/701–710, 712–722
See application file for complete search history.

(56) References Cited

U.S. PATENT DOCUMENTS

| | | | |
|---|---|---|---|
| 4,132,856 A | 1/1979 | Hutchinson et al. | |
| 4,730,232 A | 3/1988 | Lindberg | |
| 5,172,756 A * | 12/1992 | Jayamanne et al. | 165/80.3 |
| 5,191,512 A * | 3/1993 | Ogura et al. | 361/720 |
| 5,199,896 A | 4/1993 | Mosquera | |
| 5,276,423 A | 1/1994 | Breit et al. | |
| 5,367,253 A | 11/1994 | Wood et al. | |
| 5,751,552 A | 5/1998 | Scanlan et al. | |
| 6,300,781 B1 | 10/2001 | Yap et al. | |
| 6,349,032 B1 | 2/2002 | Chan et al. | |
| 6,396,290 B1 | 5/2002 | Kimura et al. | |
| 6,712,486 B1 | 3/2004 | Popovich et al. | |
| 6,735,084 B1 * | 5/2004 | Choi et al. | 361/704 |
| 7,110,257 B2 * | 9/2006 | Hachiya | 361/697 |
| 7,310,227 B2 * | 12/2007 | Kusamoto et al. | 361/695 |
| 7,414,850 B2 * | 8/2008 | Hung | 361/719 |
| 7,505,274 B2 * | 3/2009 | Yu | 361/710 |
| 7,639,503 B2 * | 12/2009 | Tanaka | 361/719 |
| 7,876,561 B2 * | 1/2011 | Schnetzka et al. | 361/699 |
| 2005/0117307 A1 * | 6/2005 | Tanaka | 361/719 |
| 2005/0174744 A1 * | 8/2005 | Zheng | 361/760 |
| 2006/0032615 A1 | 2/2006 | Dussinger et al. | |
| 2006/0193118 A1 * | 8/2006 | Ahmad et al. | 361/760 |
| 2007/0102142 A1 * | 5/2007 | Reis et al. | 165/80.3 |

FOREIGN PATENT DOCUMENTS

FR  2 880 511  7/2006
WO  2009126544  10/2009

* cited by examiner

*Primary Examiner* — Courtney Smith
(74) *Attorney, Agent, or Firm* — Hahn Loeser & Parks LLP

(57) ABSTRACT

An electronic module is employed with at least one interiorly positioned fastener that at least partially secures a central region of the electronic module to an object to prevent bowing or warping. The module contains a base, at least two peripheral fasteners at opposed ends of the module, and the at least one interiorly positioned fastener, wherein the base is capable of accepting electronic components and further includes at least one layer, and wherein the at least one interiorly positioned fastener is interposed between the at least two peripheral fasteners.

20 Claims, 5 Drawing Sheets

ELECTRONIC MODULE WITH CENTER MOUNTING FASTENERS

TECHNICAL FIELD

The invention described herein relates generally to electronic modules that utilize at least one center mounting fastener.

BACKGROUND OF THE INVENTION

Electronic modules are basically self-contained functional units that are used to create a larger system. Electronic modules may be situated on a separate base or portion to allow a user to systematically test for error, quickly replace a failed module, and in this particular case, effectively dissipate heat. The bottom-most portion of an electronic module may be comprised of a material that quickly dissipates or collects heat in order to divert it away from the electronic modules, which are the source of the heat. This heat dissipating component of the electronic module is preferably metallic in nature. The greater the surface area of the metallic component of the electronic module, the faster it can dissipate heat. However, certain applications require modules that are only capable of housing a few components. In those situations, not only is the dispersion of heat required, but the dispersion must be highly efficient or at least capable of diverting the heat without damage to the components. In certain applications, hundreds of Amps of electricity may pass through an electric component and if not cooled, can reach a temperature of about ninety (90) degrees Celsius, a temperature close to the degradation temperature of the electronics in the module. In these cases, the base of the module must be extremely efficient at dissipating heat in order for the electronic components not to prematurely fail or burn out. Moreover, this dissipation of heat allows the components to function properly.

Existing electronic modules are attached to a variety of devices, such as printed circuit boards (PCBs), housings, objects, etc., usually by screws, typically positioned at the corners of the electronic module. If the electronic modules produce a large amount of heat, the electronic modules are placed on and in contact with heat sinks, which assist the electronic module in the dispersion of the heat. Moreover, when electronic modules become hot due to the heat created by the components, the electronic modules tend to bow and bend creating a gap between the electronic module and the object it is resting on, as shown, but not drawn to scale, in FIG. 6. This gap may be a small numeric value, but in certain instances, this gap can cause hot spots to form on the electronic module. These hot spots, if not alleviated quickly, may have negative consequences such as burning out or premature failure of the electronic components.

Larger and thicker electronic modules are able to quickly and more efficiently dissipate heat created by components. However, while larger and thicker electronic modules may be more desirable, certain devices and applications may require smaller and thinner electronic modules because of space restraints. Smaller and thinner electronic modules will begin to bow at a smaller change in temperature when compared to a larger and thicker electronic module. This means that smaller and thinner electronic modules will begin to bow sooner, thereby creating hot spots, at a earlier time than larger and thicker electronic modules under the same circumstances and environment.

Another factor of electronic module bowing is the inherent nature of electronic module manufacturing. Electronic modules are not manufactured perfectly level or even, thereby creating a "bowed" electronic module. When these "bowed" modules are placed on a heat sink, an initial gap is formed between the module and the heat sink. Currently, conventional methods of securing an electronic module to a heat sink do not reduce the gap created between the module and the heat sink. Moreover, when a module is secured to a heat sink by fasteners, the clamping force created by each fastener may not be equal, creating asymmetrical clamping forces throughout the module. This uneven distribution of clamping forces causes the electronic module to bow, thereby diminishing the surface area of the module that contacts the heat sink. This reduction in contact surface area decreases the amount of heat that flows from the electronic module to the heat sink, and in so doing, overheating components that are attached to the module.

As stated above, this bow or gap that is created decreases the amount of heat that is dissipated from components in the region of bowing or phrased alternatively, where the contacting engagement is with less force, which then overheats. Moreover, certain materials tend to bow quicker than other materials because of their innate properties, particularly attributable to their thermal expansion coefficient. Depending on the material's thermal expansion coefficient, the material may bow faster or slower than a material that has a different thermal expansion coefficient. Nevertheless, manufacturing processes, asymmetrical clamping forces, the quantity, position on the electronic module, and surrounding temperature of components on an electronic module greatly affect the characteristics and rate at which the electronic module bows. Therefore, what is needed is an electronic module that may utilize at least one center mounting fastener in an interior region of the module in order to more effectively dissipate the heat created by components by maintaining forceful contiguous contact with an underlying heat sink.

Further limitations and disadvantages of conventional, traditional, and proposed approaches will become apparent to one of skill in the art, through comparison of such systems and methods with certain embodiments the claimed invention as set forth in the remainder of the present application with reference to the drawings.

SUMMARY OF THE INVENTION

In one embodiment of the invention an electronic module is employed with at least one interiorly positioned fastener that at least partially secures a central region of the electronic module to an object to prevent bowing or warping. The module contains a base, at least two peripheral fasteners at opposed ends of the module, and the at least one interiorly positioned fastener, wherein the base is capable of accepting electronic components and further includes at least one layer, and wherein the at least one interiorly positioned fastener is interposed between the at least two peripheral fasteners.

In another embodiment of the invention an electronic module is employed with at least one interiorly positioned fastener that at least partially secures a central region of the electronic module to a heat sink to prevent bowing or warping. The module contains a base, at least two peripheral fasteners at opposed ends of the module, and the at least one interiorly positioned fastener, wherein the base is capable of accepting electronic components. The base includes at least one layer, and optionally more than one layer, e.g., three or more layers. When the base has three layers, it preferably includes a first metallic layer, an intermediary dielectric layer, and a third metallic layer, wherein the first metallic layer further comprises a peripheral outer edge, wherein the peripheral outer edge is at least a minimum distance from sides of the third layer to create a non-conductive zone, and wherein the at least one interiorly positioned fastener is interposed between the at least two peripheral fasteners and interiorly of the first metallic layer.

In yet another embodiment of the invention an electronic module contains a base, at least two peripheral fasteners, and the at least one interiorly positioned fastener, means for selecting a location for the at least one interiorly positioned fastener that at least partially secures a central region of the electronic module to an object to prevent bowing or warping a base, means for attaching electronic components to the base, and wherein the base further includes at least one layer, means for securing the electronic module to the object.

In still another embodiment of the invention an electronic module is employed with at least one interiorly positioned fastener that at least partially secures a central region of the electronic module to an object to prevent bowing or warping. The module contains a base and the at least one interiorly positioned fastener, wherein the base is capable of accepting electronic components and further includes at least one layer, and wherein the at least one interiorly positioned fastener is interposed between the at least two peripheral fasteners.

These and other advantages and novel features of the claimed invention, as well as details of illustrated embodiments thereof, will be more fully understood from the following description and drawings.

DETAILED DESCRIPTION OF THE INVENTION

The best mode for carrying out the invention will now be described for the purposes of illustrating the best mode known to the applicant at the time. The examples are illustrative only and not meant to limit the invention, as measured by the scope and spirit of the claims.

The term "bowing" as used herein means the curvature of a substrate about a median plane. The term "warping" as used herein means the linear displacement of the surface of a substrate with respect to a line defined by the center of the substrate.

Generally, thermal expansion is the increase in volume of a material as temperature increases. As long as the pressure remains constant, whenever there is a change in temperature, a material's size and dimension will change accordingly. The coefficient of thermal expansion describes how the size of an object changes with a change in temperature. Specifically, it measures the fractional change in volume per degree change in temperature at a constant pressure. These measurements can also be calculated using equations that take in consideration the object's length, the change in temperature, the material's coefficient of thermal expansion, etc. As such, there are many existing equations that pertain to a material's thermal expansion, the more commonly used equations being related to the material's length, area, and volume. Though there are multiple complex variations of such equations, provided below are a few equations in a simpler form for illustrative purposes and not for limiting the invention.

Figure 10:
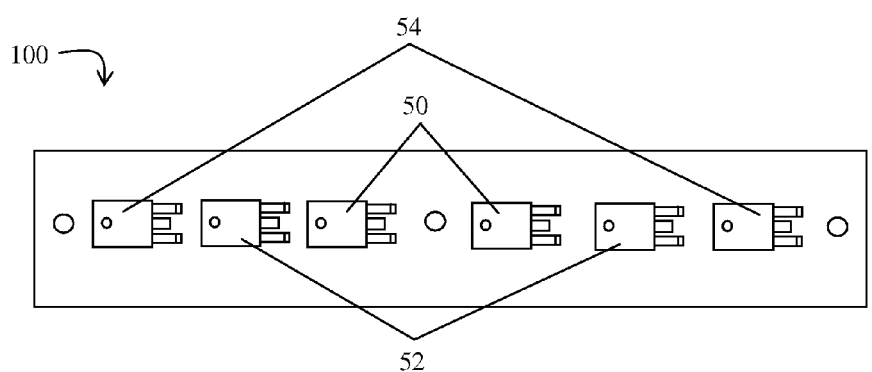
FIG. 10 illustrates a top elevational view of another embodiment of a module with one center mounting aperture.

Without being held to any one theory or mode of operation, it is believed that, as shown in Table 1, bowing may be caused by thermal expansion or imparted by a manufacturing process and has a detrimental effect on electronic components. As a "bowed" module, the module is disengaged (or alternatively, secured to the heat sink with less force) from the heat sink, it thereby retains more of its heat. Heat is generated by electronic components and if the module cannot dissipate the generated heat, components themselves will overheat and perhaps become damaged. Table 1 shows a "before" and "after" set of temperatures that were measured across components on multiple examples of three layer modules, with and without center fasteners in the circuit boards. Different thermally conductive materials were also used during the experiment. The examples described as "Prior Art" were designed without the implementation of center fasteners, while the examples designated as "Invention" utilized center fasteners. As shown, diodes operating on modules with center fasteners have lower operating temperatures than diodes operating on modules without center fasteners, at times lowering the temperature of the diode by thirty five (35) degrees Celsius or more. FIG. 10 illustrates electronic module 100 with heat generating electronic components 50, 52, and 54, wherein component 50 represents Component A in Table 1, wherein component 52 represents Component B in Table 1, and wherein component 54 represents Component C in Table 1.

TABLE 1

Temperature Differences Between Components on Modules With and Without Center Fasteners

| Module | Input Amps | Output Amps | Output Volts | Output Watts | Thermally Conductive Material | Thermally Conductive Material Thickness | Run Time (Min.) | Component A (° C.) | Component B (° C.) | Component C (° C.) |
|---|---|---|---|---|---|---|---|---|---|---|
| Invention (A) | 230 | 98.8 | 1.07 | 105.72 | Dow* 340 | 5 mil | 30 | 29.2 | 30.6 | 30.8 |
| Prior Art (A') | 230 | 99.9 | 1.04 | 103.9 | Dow* 340 | 5 mil | 30 | 49.1 | 46.7 | 34.4 |

TABLE 1-continued

Temperature Differences Between Components on Modules With and Without Center Fasteners

| Module | Input Amps | Output Amps | Output Volts | Output Watts | Thermally Conductive Material | Thermally Conductive Material Thickness | Run Time (Min.) | Component A (° C.) | Component B (° C.) | Component C (° C.) |
|---|---|---|---|---|---|---|---|---|---|---|
| Invention (B) | 230 | 100.6 | 1.02 | 102.61 | Dow* 340 | 2 mil | 30 | 28.3 | 29.2 | 29.3 |
| Prior Art (B') | 230 | 100.2 | 1.078 | 108.02 | Dow* 340 | 2 mil | 30 | 63.4 | 61.3 | 43.3 |
| Invention (C) | 230 | 96.7 | 1.065 | 102.99 | Burndy ® Penetrox | 5 mil | 30 | 30.3 | 31.8 | 31.8 |
| Prior Art (C') | 230 | 98.5 | 1.04 | 102.44 | Burndy ® Penetrox | 5 mil | 30 | 41.9 | 41.6 | 35.9 |
| Invention (D) | 230 | 98.7 | 1.073 | 104.94 | Dow* TC-5121 | 5 mil | 30 | 37.5 | 37.9 | 38.1 |
| Prior Art (D') | 230 | 98.9 | 1.06 | 104.83 | Dow* TC-5121 | 5 mil | 30 | 48.2 | 47.1 | 41.8 |
| Invention (E) | 230 | 98.5 | 1.078 | 106.18 | Dow* TC-5022 | 5 mil | 30 | 29 | 29.5 | 29.2 |
| Prior Art (E') | 230 | 97.3 | 1.066 | 103.72 | Dow* TC-5022 | 5 mil | 30 | 34.1 | 35.8 | 31.5 |

*Dow represents Dow Corning ®

Figure 1:
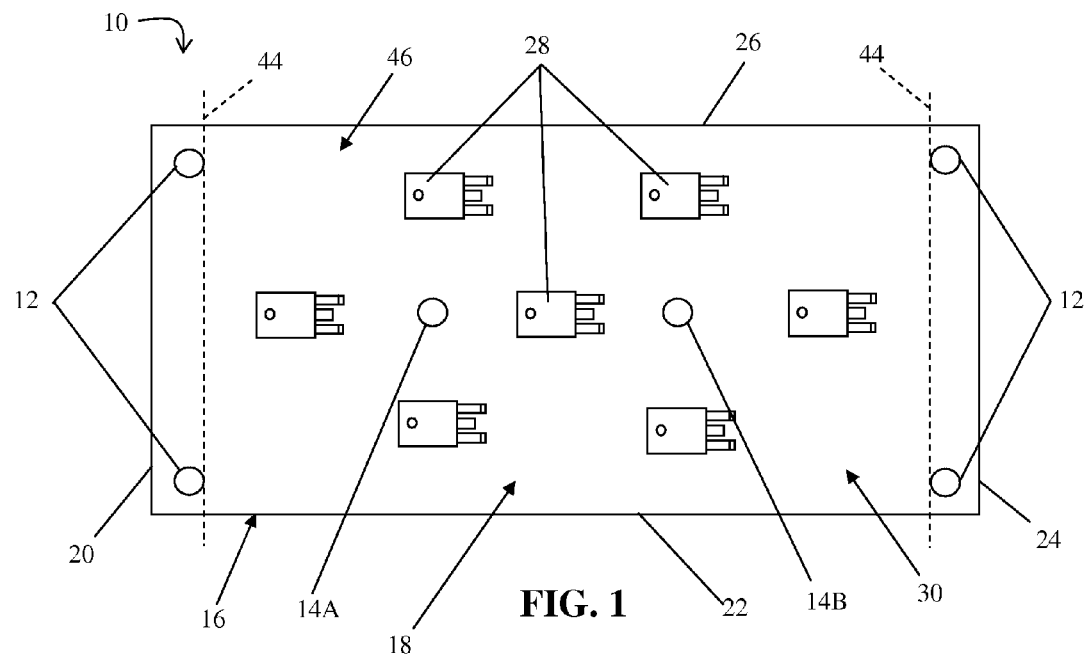
FIG. 1 illustrates a top elevational view of an embodiment of a module with at least one center mounting aperture (two apertures being illustrated in the figure)
Figure 2:
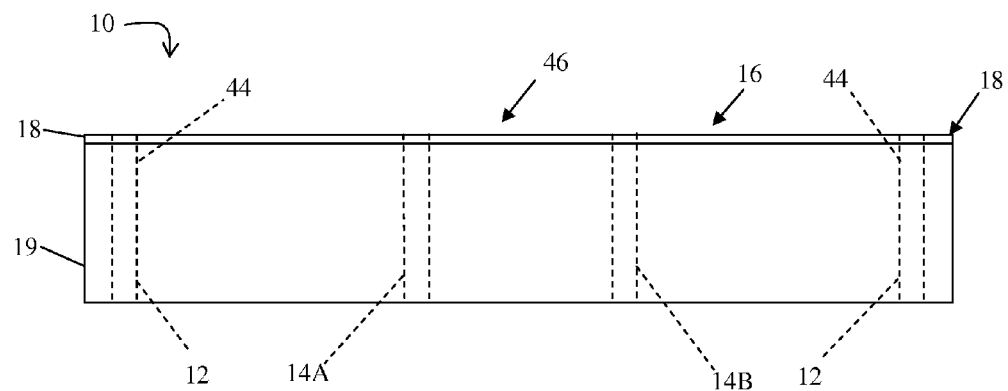
FIG. 2 illustrates a side perspective view of FIG. 1.
Figure 3:
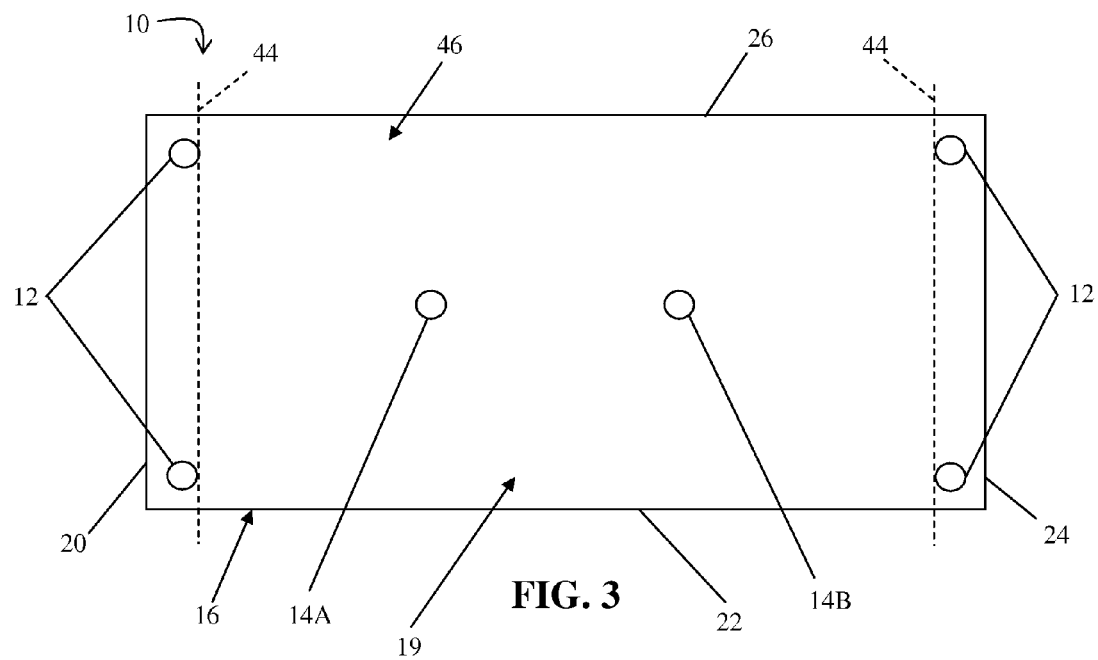
FIG. 3 illustrates a bottom elevational view of FIG. 1.

FIGS. 1 through 3 illustrate multiple views of an embodiment of the invention, namely, electronic module 10 which includes base 16, at least two peripheral fasteners 12 (four apertures illustrated in the figures), and at least one central fastener (two central fasteners 14A and 14B illustrated). Depending on the size of base 16, more or less central fasteners 14A and/or 14B and peripherally-positioned fasteners 12 may be utilized. It is recognized that fasteners 12 may also be positioned parallel to, and interiorly of any of sides 20, 22, 24 or 26, and located at a corner or along an edge of electronic module 10. It is also recognized that electronic module 10 may be fastened to an object utilizing the at least one central fastener 14A and/or 14B, without the inclusion of the at least two peripheral fasteners 12 although not preferred. The number of non-interior fasteners is typically at least two, and may increase to eight or more, depending on the needs of the application. Base 16 is made of a material, preferably metallic, that dissipates heat such as copper, tin, or aluminum and alloys thereof. Base 16 may also include multiple layers and have first side 20, second side 22, third side 24, and fourth side 26. FIG. 2 shows an embodiment of the invention that may include base 16 having two layers, first top layer 18 and second bottom layer 19. First layer 18 may be an insulating layer that does not substantially conduct electricity, while second layer 19 is typically a metallic material that dissipates heat, such as copper, tin, and aluminum or alloys thereof.

Figure 9:
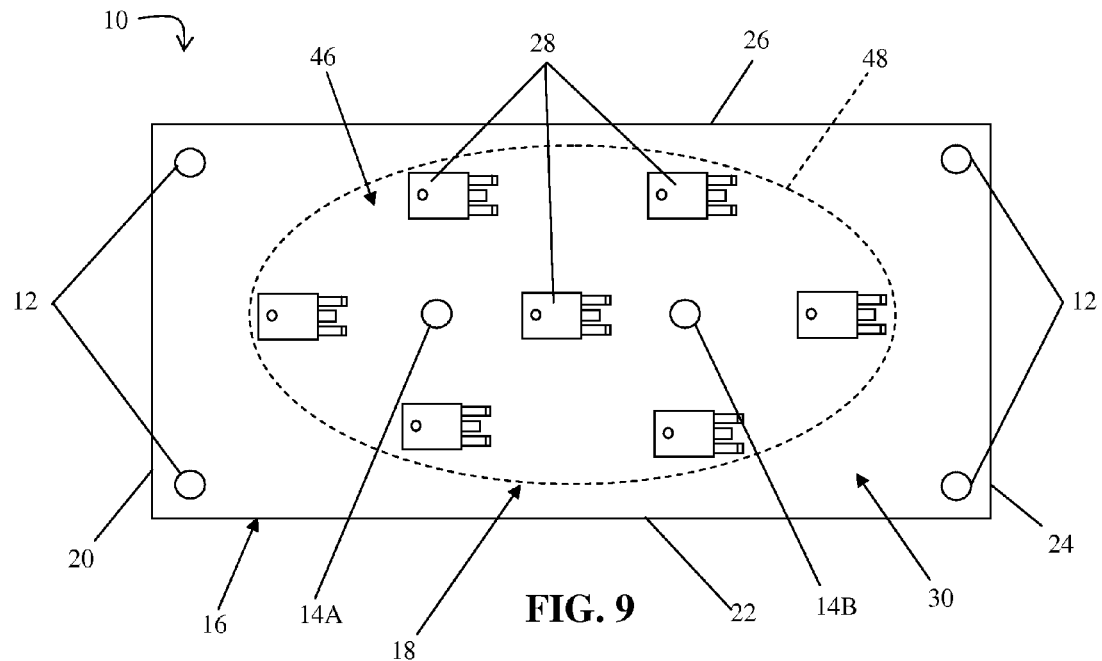
FIG. 9 illustrates a top elevational view of another embodiment of a module with at least one center mounting aperture (two apertures being illustrated in the figure)

With continued reference to FIGS. 1 through 3, the at least one central fastener 14A and/or 14B is located within central region 46 of electronic module 10. Central region 46 may include the area interposed between the at least two peripherally-positioned fasteners 12 or between tangential lines 44, which are perpendicular to sides 22 and 26 and tangent to the innermost circumferential edge of each of peripheral fasteners 12. Tangential lines 44 may also be perpendicular to sides 22 and 26 and tangent to the innermost circumferential edge of the innermost peripheral fastener 12 of sides 20 and 24. FIG. 9 illustrates central region 46 as being defined by inner region perimeter 48 that outlines components 28. Inner region perimeter 48 may also be tangential to components 28, nearly contacting the outermost point of components 28. The shape of inner region perimeter 48 may be an eclipse as shown in FIG. 9, but the shape may also be circular, square, rectangular, or oblong in shape.

Figure 4:
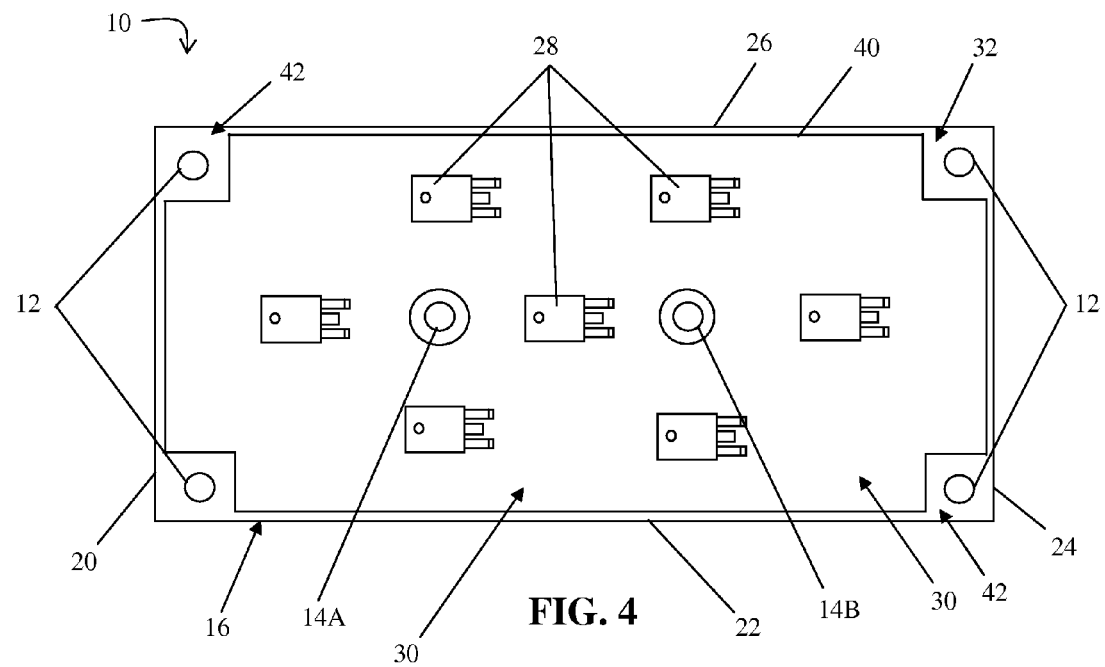
FIG. 4 illustrates a top elevational view of another embodiment of a module with at least one center mounting aperture (two apertures being illustrated in the figure)
Figure 5:
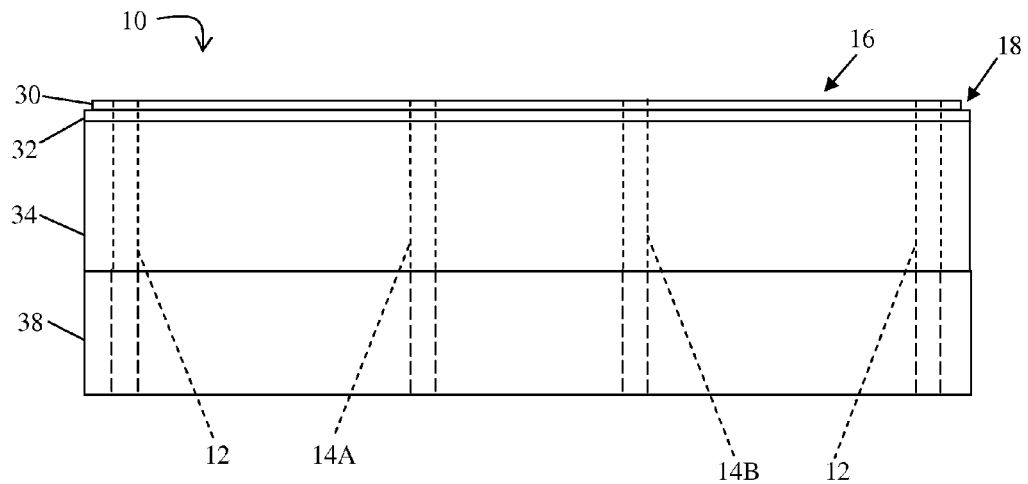
FIG. 5 illustrates a side perspective view of FIG. 4.
Figure 6:
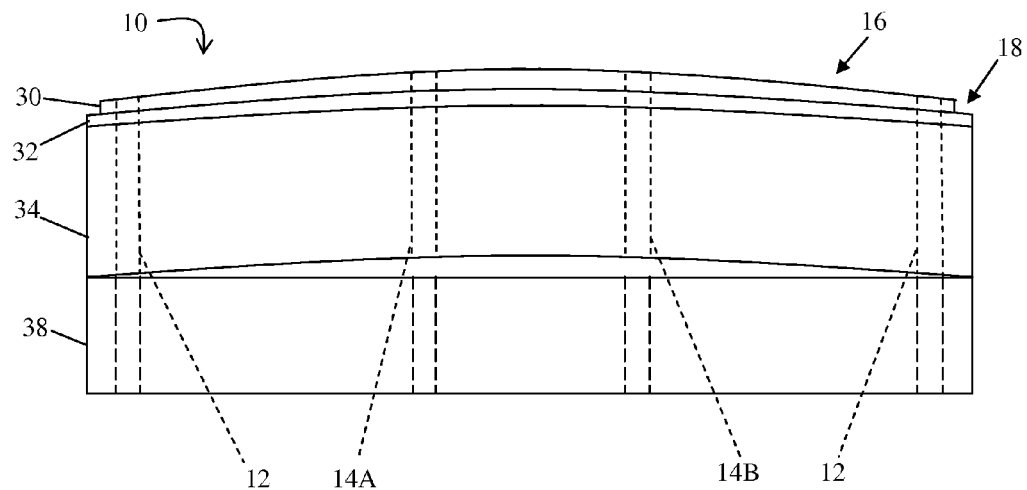
FIG. 6 illustrates a side perspective view of a stylized depiction of a "bowed" module of FIG. 4, not shown to scale.
Figure 7:
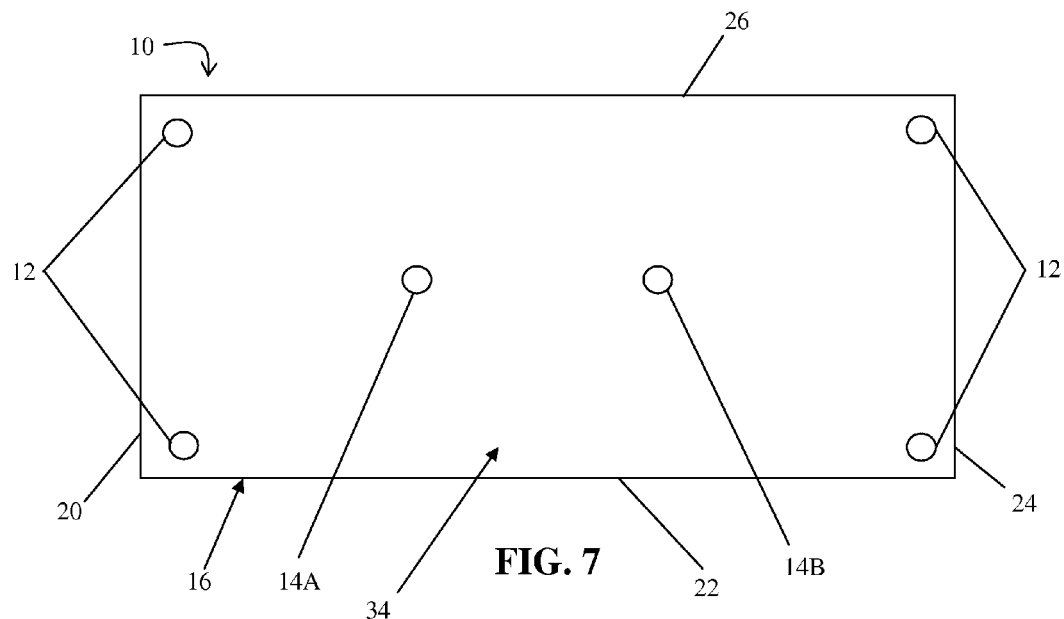
FIG. 7 illustrates a bottom elevational view of FIG. 4.

FIGS. 4 through 7 shows another embodiment of the claimed invention that may include base 16 as having three layers, first layer 30, intermediary layer 32, and third layer 34, as shown in FIG. 5, the thickness of each being chosen using sound engineering, and which thickness may be the same or different as illustrated in FIG. 5. First and third layer 30 and 34 may be made of a heat dissipating material, preferably a conductive metal, while intermediary layer 32 is a dielectric layer made of a ceramic material that is both thermally conductive and electrically insulting, non-limiting examples of which include Bergquist® Thermal Clad®. If, however, components 28 have their contact leads on their bottom-most surface, thereby "shorting" components 28, base 16 may include another insulating layer between components 28 and first layer 30. Base 16 is capable of accepting and housing components 28, such as diodes, transistors, semi-conductor chips, or any other type of components one of ordinary skill in the art may realize. Components 28 are attached to base 16 with solder, which is also a thermal conductive material that can dissipate heat quickly and efficiently. Base 16 dissipates the heat that is generated by components 28 when an electric current passes through components 28.

The at least two peripheral fasteners 12 and the at least one central fastener 14A and/or 14B fasten electronic module 10 to an object or article that may include a printed circuit board (PCB), a housing, a container, a device, or any other object that may be realized by persons of ordinary skill in the art that may utilize an electronic module. When attaching the electronic module 10 to a PCB, the electronic module 10 is mounted onto heat sink 38, as shown in FIG. 5, to most effectively dissipate generated heat. Heat sinks 38 are also made of a metallic material that can quickly dissipate heat, such as copper, aluminum, and tin and alloys thereof. Electronic module 10 is joined, permanently or temporarily, to heat sink 38 with a thermally conductive compound, non-limiting examples of which include Dow Corning® 340 Heat Sink Compound, Dow Corning® TC-5121, Indium 14993 Y, 99.9% Indium-Waffle Cut, or Burndy® Penetrox Heat Sink Grease. This thermally conductive compound facilitates the exchange of heat between electric module 10 and heat sink 38.

The at least two peripheral fasteners 12 and the at least one central fastener 14A and/or 14B may be fastened to an object or article by holes and screws, clips, snap-on's, hooks and loops, nails, nuts and bolts, rivets, or any other fasteners that may be realized by persons of ordinary skill in the art that may securely fasten electronic module 10 to the object, article, or heat sink. The diameter of the at least two peripheral fasteners 12 and the at least one central fastener 14A and/or 14B may be substantially equal, or may be independently different. In one aspect of the invention, the at least two peripheral fasteners 12 and the at least one central fastener 14A and/or 14B are torqued to a pressure of about fifty (50) inch/pounds, with a variable range of about two (2) inch/pounds, onto electronic module 10. This range in pressure from forty-eight to fifty-two (48-52) inch/pounds allows electronic module 10 to be sufficiently in contact with an object, such as a heat sink. The uniform amount of pressure created by the at least two peripheral fasteners 12 and the at least one central fastener 14A and/or 14B allows for maximum contiguous contact between the adjacent surfaces of electronic module 10 and heat sink 38. The more surface area of electronic module 10 that comes into contact with a heat sink and/or thermally conductive compound, the more efficient heat is dissipated from components 28 and localized hot spots are minimized. Moreover, in order for electronic module 10 to be properly mounted onto a heat sink, the heat sink has corresponding peripheral and central fasteners, such as an internally threaded hole if the at least one central fastener 14A and/or 14B is a threaded hole and mating screw.

With continued reference to FIGS. 4 through 7 just as first and third layer 30 and 34 are separated by a dielectric layer 32 to create electrical isolation, first layer 30 is also set apart from the at least two peripheral fasteners 12, the at least one central fastener 14A and/or 14B, and/or the sides 20, 22, 24 or 26, to create electrical isolation, as shown in FIGS. 4 and 5. The minimum distance between first layer 30 and the at least two peripheral fasteners 12, the at least one central fastener 14A and/or 14B, and/or the sides 20, 22, 24 or 26 depends on a variety of factors, one being the working voltage that is used by electronic module 10. The corresponding minimum distances with respect to the working voltage used is defined by the International Electrotechnical Commission (IEC) reference, particularly IEC 60974-1, which is a standard relied upon by the industry. Voltage specifications are dependent on the application of a device and other properties such as maximum thresholds of an electronic component. The minimum distance between first layer 30 and the at least two peripheral fasteners 12, the at least one central fastener 14A and/or 14B, and/or the sides 20, 22, 24 or 26 may also be increased to accommodate other factors such as ease of manufacturing. In an embodiment of the claimed invention, a voltage range of about forty (40) to nine hundred (900) Volts may be utilized.

The area between outer edge 40, of first layer 30, and sides 20, 22, 24, and 26 and the at least two peripheral fasteners 12 is a non-conductive zone 42 that also electrically isolates first layer 30 and third layer 34. This electrical isolation decreases the chances of creating a potential between the layers. If the distance between first layer 30 and the at least two peripheral fasteners 12, the at least one central fastener 14A and/or 14B, and/or the sides 20, 22, 24 or 26 is not large enough, a potential is created and will act as a connection between the two layers, thereby creating a "short" between first layer 30 and third layer 34. Unless intentional, creating a potential or connection between two layers that are meant to be separate may cause certain connections to "short" and function improperly. The distance between first layer 30 and the at least two peripheral fasteners 12, the at least one central fastener 14A and/or 14B, and the sides 20, 22, 24 or 26 is determined by sound engineering and in conjunction with reference to IEC 60974-1 to prevent conductive metallic layers from "connecting" to one another.

The portion or area as described by first layer 30 is the interior region of electronic module 10 in which the at least one central fastener 14A and/or 14B may be located. The at least one central fastener 14A and/or 14B may be located anywhere within this interior region to secure electronic module 10 to an object, such as heat sink 38. Components 28 are also located within this interior region of electronic module 10 in order to prevent a "short" from occurring between itself and an electrically conductive material, such as copper. The distance between components 28 and the boundaries and perimeter of the interior region of the electronic module 10 is determined by sound engineering to prevent components 28 from "shorting" or from creating an undesirable connection.

Figure 8:
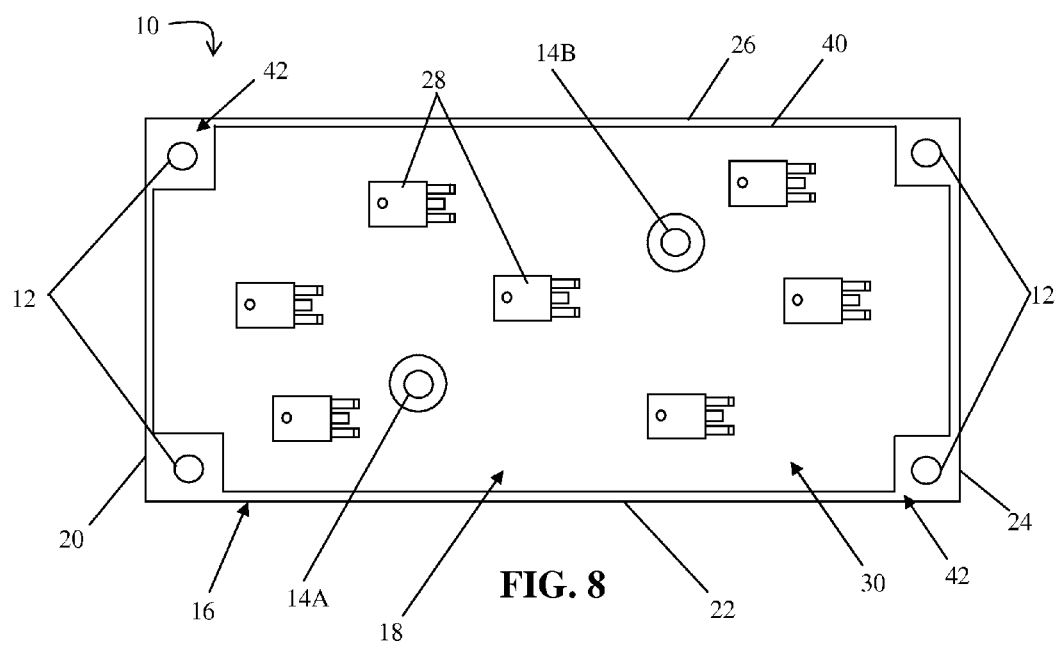
FIG. 8 illustrates a top elevational view of another embodiment of a module with at least one offset center mounting aperture (two apertures being illustrated in the figure)

The at least one central fastener 14A and/or 14B is located in the interior region of electronic module 10 and base 16. The interior region of base 16 is also located interiorly of first side 20, second side 22, third side 24, and fourth side 26. In one embodiment of the invention, the at least one central fastener 14A and/or 14B may be located at a point near the center, intersecting the midpoint of each side of base 16. The point near the center of base 26 may be substantially equidistant from first side 20 and third side 24, and substantially equidistant from second side 22 and fourth side 26. In another embodiment of the invention, wherein the at least one central fastener 14A and/or 14B are two central fasteners, these fasteners may be positioned in a spread apart in an offset manner but positioned interiorly of each peripheral edge, as shown in FIG. 8. The location of the at least one central fastener 14A and/or 14B within the interior region of base 16 is selected by sound engineering, taking into consideration the number of components 28, amount of current delivered to components 28, manufacturer specifications regarding components 28, and etc.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An electronic module comprising:
   a base comprising an upper insulating layer that does not substantially conduct electricity and a lower heat-dissipating layer both layers spanning across at least six heat-generating electronic components,
   at least one peripheral fastener at each opposed end of said module,
   at least one interiorly positioned, non-peripheral fastener between said at least one peripheral fastener at each opposed end of said module, said non-peripheral fastener positioned between said at least six electronic components,
   wherein a top surface of said upper layer of said base comprises at least six electronic components, and
   wherein said at least one interiorly positioned fastener is interposed between said at least two peripheral fasteners and said at least six electronic components and directly through said upper layer of said base and at least into or through said lower layer to maintain contacting engagement between said layers by said at least one interiorly positioned fastener to prevent bowing or warping between said layers of said module, said module operating at between 40 to 900 volts said module comprising at least six heat generating modules, at least three modules being coaxial along a longitudinal axis of said module.

2. The electronic module of claim 1, wherein
said at least one interiorly positioned fastener is interposed between a pair of tangent lines from an innermost circumferential edge of said peripheral fasteners which perpendicularly intersect a side of said module.

3. The electronic module of claim 1, wherein
said at least one interiorly positioned fastener attaches said central region of said electronic module to an object by a screw.

4. The electronic module of claim 3, wherein
said screw applies a force of about forty eight to fifty two inch/pounds.

5. The electronic module of claim 1, wherein
said lower heat-dissipating layer is a heat sink.

6. The electronic module of claim 5, wherein
said heat sink comprises correspondingly positioned at least two peripheral fasteners and at least one interiorly positioned fastener.

7. The electronic module of claim 1, wherein
said lower heat-dissipating layer is metallic.

8. The electronic module of claim 1, wherein
wherein said upper insulating layer is a dielectric layer.

9. The electronic module of claim 1, wherein
said base is three layers, wherein said three layers further comprises a first metallic layer, an intermediary dielectric layer, and a third metallic layer.

10. The electronic module of claim 9, wherein
said first metallic layer further comprises a peripheral outer edge, wherein said peripheral outer edge is at least a minimum distance from sides of said third layer to create a non-conductive zone.

11. The electronic module of claim 10, wherein
said at least one interiorly positioned fastener is located within said peripheral outer edge of said first metallic layer.

12. The electronic module of claim 1, wherein
said at least one interiorly positioned fastener is two interiorly positioned fasteners.

13. The electronic module of claim 1, wherein
said at least one interiorly positioned fastener is an opening.

14. The electronic module of claim 13, wherein
said opening is a hole.

15. The electronic module of claim 1, wherein
said at least one interiorly positioned fastener is located at a point near a center of said electronic module.

16. An electronic module comprising:
a base, said base comprising at least six heat-generating electronic modules,
at least two peripheral fasteners, each peripheral fastener positioned at opposed ends of said module,
at least one interiorly positioned fastener situated between said at least six electronic modules,
wherein said base comprises electronic components and further comprises at least one layer,
wherein said at least one layer of said base is three layers, said layers spanning between said at least six electronic modules, wherein said three layers further comprises a first metallic layer, an intermediary dielectric layer, and a third metallic layer,
wherein said first metallic layer further comprises a peripheral outer edge, wherein said peripheral outer edge is at least a minimum distance from sides of said third layer to create a non-conductive zone, and
wherein said at least one interiorly positioned fastener is interposed between said at least two peripheral fasteners and interiorly of said first metallic layer, said at least one interiorly positioned fastener at least partially securing a central region of said three layers to prevent bowing or warping,
said module operating at between 40 to 900 volts,
said module comprising at least six heat generating modules at least three modules being coaxial along a longitudinal axis of said module.

17. An electronic module comprising:
a base comprising an upper insulating layer that does not substantially conduct electricity and a lower heat-dissipating layer, both layers spanning across at least six heat-generating electronic components,
at least two peripheral fasteners each fastener positioned at an opposed peripheral edge of said base,
at least one interiorly positioned fastener situated in a non-peripheral region between said at least six electronic modules,
means for selecting a location for said at least one interiorly positioned fastener that at least partially secures a central region of said electronic module to a heat-dissipating object to prevent bowing or warping of said base,
means for attaching electronic components to said base, and wherein said base further comprises at least one layer,
means for securing said electronic module to said object.

18. An electronic module with at least one interiorly positioned fastener that at least partially secures a central region of said electronic module to an object to prevent bowing or warping, comprising:
a base comprising a heat sink essentially coextensive with said base and spanning at least six heat-generating electronic components and said at least one interiorly positioned fastener to fasten said base and said heat sink,
wherein said base comprises the at least six heat-generating electronic components and further comprises at least one layer, and
wherein said at least one interiorly positioned fastener is interposed between said at least two peripheral fasteners and between at least three of the six of said electronic components on said base.

19. The electronic module of claim 18, wherein said module further comprises
at least two peripheral fasteners at opposed ends of said module.

20. The electronic module of claim 18, wherein said at least one layer of said base is three layers, wherein said three layers further comprises
a first metallic layer,
an intermediary dielectric layer, and
a third metallic layer.

* * * * *

UNITED STATES PATENT AND TRADEMARK OFFICE
CERTIFICATE OF CORRECTION

PATENT NO.         : 8,233,280 B2
APPLICATION NO.    : 12/724040
DATED              : July 31, 2012
INVENTOR(S)        : Koprivnak et al.

Page 1 of 1

It is certified that error appears in the above-identified patent and that said Letters Patent is hereby corrected as shown below:

Claim 8, Column 9, Line 28, delete "wherein".

Signed and Sealed this
Sixth Day of November, 2012

David J. Kappos
*Director of the United States Patent and Trademark Office*